United States Patent
Lin et al.

(10) Patent No.: US 11,710,636 B2
(45) Date of Patent: Jul. 25, 2023

(54) METAL AND SPACER PATTERNING FOR PITCH DIVISION WITH MULTIPLE LINE WIDTHS AND SPACES

(71) Applicant: Intel Corporation, Santa Clara, CA (US)

(72) Inventors: Kevin Lin, Beaverton, OR (US); Charles Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1129 days.

(21) Appl. No.: 16/013,842

(22) Filed: Jun. 20, 2018

(65) Prior Publication Data

US 2019/0393036 A1 Dec. 26, 2019

(51) Int. Cl.
*H01L 21/033* (2006.01)
*H01L 21/3213* (2006.01)
*H01L 21/285* (2006.01)
*H01L 21/768* (2006.01)

(52) U.S. Cl.
CPC ...... *H01L 21/0338* (2013.01); *H01L 21/0332* (2013.01); *H01L 21/0337* (2013.01); *H01L 21/28556* (2013.01); *H01L 21/32133* (2013.01); *H01L 21/768* (2013.01)

(58) Field of Classification Search
None
See application file for complete search history.

(56) References Cited

U.S. PATENT DOCUMENTS 8,860,184 B2  10/2014  Sivakumar et al.
2017/0300608 A1  10/2017  Narisetty et al.

FOREIGN PATENT DOCUMENTS

WO   WO-2018063322   4/2018

OTHER PUBLICATIONS

JP 2018513565, Processing of Large-area Multilayer Nanostructures, May 24, 2018 (Year: 2018).*
Intel Corporation, "Advanced Lithography and Self-Assembled Devices", International Patent Application No. PCT/US2016/068586 filed Dec. 23, 2016, 376 pgs.
Intel Corporation, "Metal Spacer-Based Approaches for Conductive Interconnect and Via Fabrication and Structures Resulting Therefrom", International Patent Application No. PCT/US2017/038379 43 pgs.

* cited by examiner

*Primary Examiner* — Alexander G Ghyka
(74) *Attorney, Agent, or Firm* — Schwabe, Williamson & Wyatt, P.C.

(57) ABSTRACT

Metal spacer-based approaches for fabricating conductive lines/interconnects are described. In an example, an integrated circuit structure includes a substrate. A first spacer pattern is on the substrate, the first spacer pattern comprising a first plurality of dielectric spacers and a first plurality of metal spacers formed along sidewalls of the first plurality of dielectric spacers, wherein the first plurality of dielectric spacers have a first width (W1). A second spacer pattern is on the substrate, where the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers.

23 Claims, 8 Drawing Sheets

METAL AND SPACER PATTERNING FOR PITCH DIVISION WITH MULTIPLE LINE WIDTHS AND SPACES

TECHNICAL FIELD

Embodiments of the disclosure are in the field of semiconductor structures and processing and, in particular, metal and spacer patterning for pitch division with multiple line widths and spaces.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, such as metal lines or interconnects and vias, to electrically connect to other interconnects. Metal lines or interconnects are typically formed by a lithographic process. Representatively, the process generally includes forming a photoresist layer on the surface of a semiconductor wafer, and then positioning a mask over the resist-coated wafer. The mask typically has light non-transmissive (opaque) regions of chrome and light transmissive (transparent) regions of quartz. Radiation from a light source that is focused via an optical lens system is then applied to the mask. The light passes through the transparent mask regions and exposes the underlying photoresist layer, and is blocked by the opaque mask regions to leave those underlying portions of photoresist layer unexposed. Depending on the specific process used, either the exposed or non-exposed regions of the photoresist layer can then be removed, thereby leaving a patterned resist layer on the wafer. Finally, the removed portions may be filled with one or more metals or other conductive materials to form the metal lines or interconnects.

Newer spacer-based pitch division is a patterning technique that allows for the realization of patterns below the resolution limit of the exposure system being used. However, there are a number of long-standing limitations associated with such spacer-based techniques that have yet to be addressed or otherwise resolved.

DESCRIPTION OF THE EMBODIMENTS

Figure 1A:
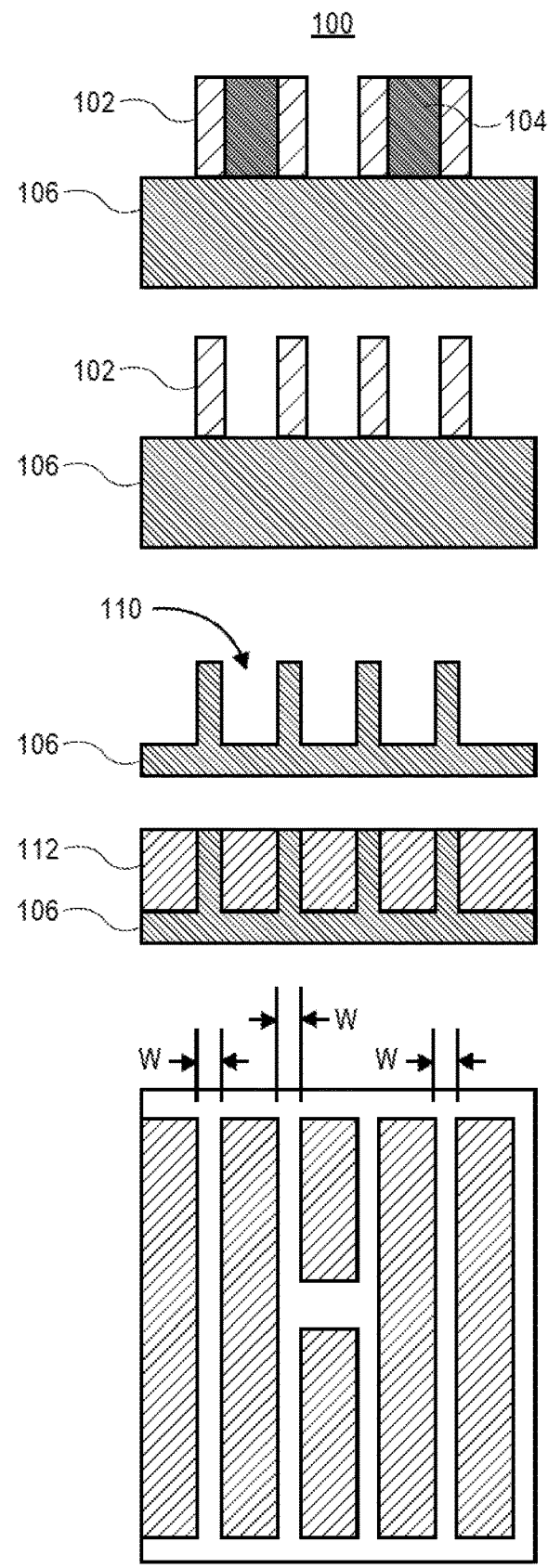
FIG. 1A illustrates three cross-sectional views and one plan view of structures formed during a SADP process.

Metal and spacer patterning for pitch division with multiple line widths and spaces are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for BEOL metal and spacer patterning for pitch division with multiple line widths and spaces. Embodiments may include or pertain to metal spacer-based approaches for conductive interconnect/metal line fabrication, and the resulting structures. One or more embodiments may be directed to the use of metal spacer-based interconnects with multiple widths, which allow for multiple line and space control. The present embodiments offer the flexibility of space control and line width control with variable space and line widths.

Production designs for 20 nm, 16 nm, 14 nm, 10 nm and 7 nm and smaller technology nodes may require one form or another of multi-patterning. Multi-patterning processing schemes may be implemented to enable, or as part of, embodiments described herein. An early form of multi-patterning (MP) is pitch division patterning, which typically refers to pitch halving, pitch quartering etc. Pitch division schemes may be applicable to FEOL processing, BEOL processing, or both FEOL (device) and BEOL (metallization) processing. Optical lithography is first implemented to print unidirectional lines (e.g., either strictly unidirectional or predominantly unidirectional) in a pre-defined pitch. Pitch division processing is then implemented as a technique to increase line density. Typically the layouts are unidirectional but they can be bi-directional as well.

Self-aligned double patterning (SADP) is one example of a MP technique, to implement to double line density. FIG. 1A illustrates three cross-sectional views and one plan view of structures 100 formed during a SADP process. In SADP, a spacer 102 is formed on the sidewalls of pre-patterned metal lines/features 104 (referred to as a backbone or mandrel) representing the first mask/deposition of a first set of conducting lines) on an interlayer dielectric (ILD) 106. The spacer 102 is formed by deposition or reaction of a film layer on the previous pattern, followed by etching to remove all the film material on the horizontal surfaces, leaving only the material on the sidewalls to provide two spacers for every metal line 104. The metal lines 104 are then removed, leaving the spacers 102 remaining. Because there are two spacers 102 for every metal line 104, line density is doubled. The pattern of the spacers 102 is then etch transferred down to the ILD 106, creating trenches 110 in the ILD 106. The trenches 110 are filled with a metal, such as copper, and the metal is planarized to form interconnect lines 112. While SADP provides good space control, the downside is that SADP results in spaces between interconnect lines 112 of a fixed width (W), and therefore lacks variability. For example, in some applications, interconnect lines 112 for high voltage signals may need to be spaced further part than interconnect lines 112 for low voltage signals, which would be a challenge for SADP.

Figure 1B:
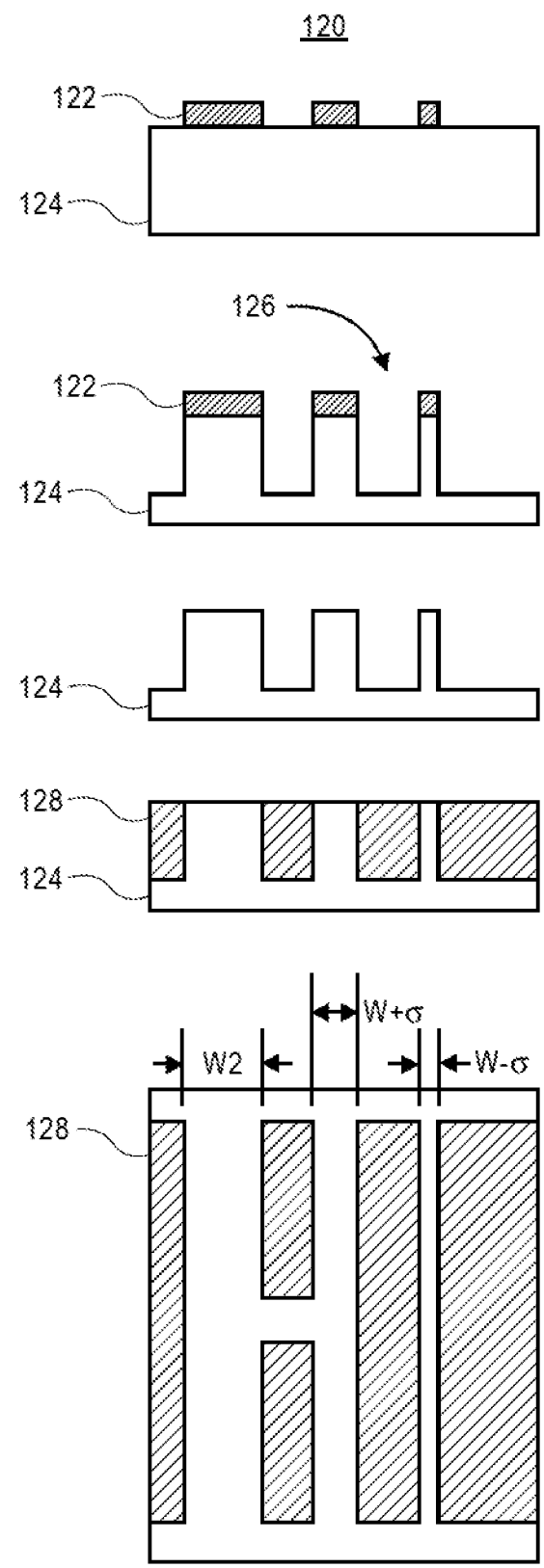
FIG. 1B illustrates four cross-sectional views and one plan view of structures formed during the litho-etch process for one of the layout masks

A second example of MP is Litho-Etch-Litho-Etch (LELE) or double patterning lithography (DPL). LELE splits dense layouts that cannot be printed with a single exposure into two or more lower-density layout masks. Two or more separate exposures are used to form two or more coarse patterns that are combined to form a denser pattern on the wafer. FIG. 1B illustrates four cross-sectional views and one plan view of structures 120 formed during the litho-etch process for one of the layout masks 122. The layout mask 122 formed on an ILD 124 is exposed and the resulting pattern is etch transferred to the ILD 124, forming trenches 126. The mask 122 is removed and the trenches 126 are filled with a metal 128, such as copper. The plan view shows an example pattern formed from double patterning, which illustrates that with LELE variable width spaces are achievable, but the space width is not well defined due to lithography registration (i.e., no self-alignment), which translates to poor space control. Space control becomes increasingly important as feature pitches becomes smaller.

Thus, improvements are needed in the area of back end metallization manufacturing technologies for metal spacer-based approaches for conductive interconnect fabrication.

Accordingly, approaches for metal and spacer patterning for pitch division with variable line widths and space widths are described. The present embodiments maintain good space control, while same time providing variable width spaces. Use of the present embodiments results in integrated circuits having the features have varying width, and where the spaces between the features are also variable and finely controlled. The approach utilizes multiple metal spacer patterning passes where each pass forms metal spacers and associated dielectric spacers. The metal spacers and associated dielectric spacers may have different widths in each patterning pass, and the widths of the metal spacers and dielectric spacers formed during the multiple patterning passes can also have different widths. Therefore, multiple metal spacer patterns results in interleaved patterns of metal and dielectric spacers having varying widths.

Figure 2:
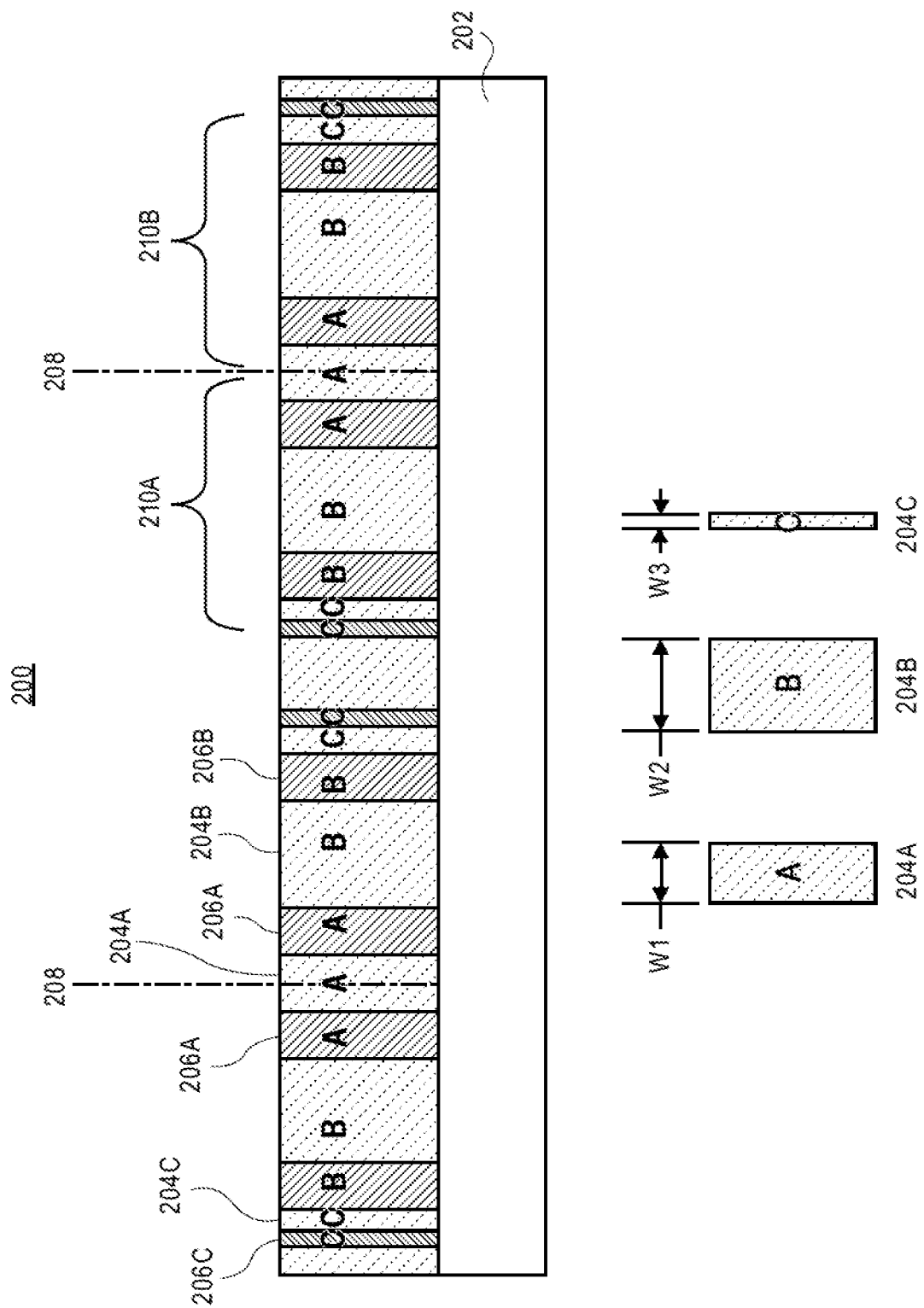
FIG. 2 illustrates a cross-sectional view of an example metallization layer of an integrated circuit formed using metal and spacer patterning that is capable of multiple line and space widths.

In accordance with the disclosed embodiments, FIG. 2 illustrates a cross-sectional view of an example metallization layer of an integrated circuit formed using metal and spacer patterning capable of multiple line and space widths.

A substrate 202 has multiple spacer patterns formed thereon, where each spacer pattern includes dielectric spacers and metal spacers. In the example shown, a first spacer pattern ("A") is formed on the substrate 202 and comprises a first plurality of the dielectric spacers 204A, and a first plurality of metal spacers 206A formed along sidewalls of the first plurality of dielectric spacers 204A. In one embodiment, the first plurality of the dielectric spacers 204A comprise a backbone pattern. In one embodiment, the first plurality of dielectric spacers 204A are formed having a first width (W1). In one embodiment the first plurality of metal spacers 206A may have the same width (W1) as the dielectric spacers 204A. In another embodiment, the first plurality of metal spacers 206A may have a different width that the dielectric spacers 204A.

A second spacer pattern ("B") is formed on the substrate 202 that may be interleaved with the first spacer pattern. The second spacer pattern comprises a second plurality of dielectric spacers 204B having a second width (W2) formed on exposed sidewalls of the first plurality of metal spacers 206A, and a second plurality of metal spacers formed 206B formed on exposed sidewalls of the second plurality of dielectric spacers 204B. In this example, the width (W2) of the second plurality of dielectric spacers 204B is wider than the width W1 of the first plurality of dielectric spacers 204A. In one embodiment the second plurality of metal spacers 206B may have the same width (W2) as the dielectric spacers 204B. In another embodiment, the second plurality of metal spacers 206B may have a different width that the dielectric spacers 204B.

A third spacer pattern ("C") is formed on the substrate 202 that may be interleaved with the first and second spacer patterns. The third spacer pattern comprises a third plurality of the dielectric spacers 204C formed on exposed sidewalls of the second plurality of metal spacers 206B, and a third plurality of metal spacers 206C formed along sidewalls of the second plurality of dielectric spacers 204B. In this example, the width (W3) of the third plurality of dielectric spacers 204C is narrower than W1 and W2. In one embodiment the third plurality of metal spacers 206C may have the same width (W3) as the dielectric spacers 204C. In another embodiment, the third plurality of metal spacers 206C may have a different width that the dielectric spacers 204C.

According to a further aspect of the disclosed embodiments, not only the widths may be changed from one spacer pattern to the next, but also the materials used may be different form one spacer pattern to the next. For example, the first plurality of metal spacers 206A and the second plurality metal spacers 206B may be formed using the same metal material, while the third plurality of metal spacers 206C may be formed using a different metal material.

In one embodiment, the type of metal material selected for the metal spacers 206 must have the property that the metal material can be conformally deposited via atomic layer deposition (ALD) and vertically etched. In one embodiment, the types of metal material meeting this requirement are selected from the group comprising titanium nitride, titanium, tungsten, and alloys thereof.

According to one embodiment, the interleaved spacer patterns (A, B, and C) form respective lines of symmetry 208 centered on each of the first plurality of dielectric spacers 204A, where each of the lines of symmetry 208 have two sets of dielectric spacers and metal spacers 210A and 210B that are left/right symmetric from the line of symmetry (except when the sets of dielectric and metal spacers are cutoff by a boundary). For example, the first plurality of dielectric spacers 204A are patterned first followed by the first plurality of metal spacers 206A; and the second plurality of dielectric spacers 204B are patterned second followed by the second plurality of metal spacers 206B, and so on. Therefore, the set of dielectric spacers and metal spacers 210A to the left side and the set of dielectric spacers and metal spacers 210B right side of the lines of symmetry 208 are symmetrical, e.g., "AABBCC".

In accordance with an embodiment of the present disclosure, a backbone approach is described that involves multiple stages of atomic layer deposition (ALD). In an embodiment, tight pitch formation (typically less thank 80 nm) is achieved by iterative spacer formation, e.g. atomic layer deposition (ALD).

It is to be appreciated that reverse engineering of a product fabricated using such an approach may reveal that the dielectric and metal spacers are formed by depositing a material layer using an ALD process and patterned using a spacer etch, rather formed using a damascene process. Consequently, cross-sectional scanning electron microscopy (XSEM) may reveal that the outer corners of dielectric and metal spacers have a curvature as a result of the spacer etch, rather than the square or rectangular outer corners shown in the example of FIG. 2.

FIGS. 3A-3H illustrate cross-sectional views representing various operations in a method of fabricating a metallization layer of an integrated circuit using metal and spacer patterning for pitch division capable of multiple line and space widths, in one embodiment. Structures including various preliminary and/or intermediate structures as well as the final integrated circuit are not shown, but can be implemented using any number of conventional or otherwise suitable fabrication techniques. The resulting integrated circuit can be, for example, a microprocessor, memory array, communication chip, logic array, or any other integrated circuit, for instance, having feature sizes that are below the resolution limit of the exposure system being used, and/or that could benefit from having a variable metal line and space widths.

Figure 3A:
FIGS. 3A-3H illustrate cross-sectional views representing various operations in a method of fabricating a metallization layer of an integrated circuit using metal and spacer patterning for pitch division capable of multiple line and space widths, in one embodiment.

FIG. 3A illustrates an example resulting structure after formation of a first spacer pattern over a substrate or other layer, which includes first forming a backbone pattern. In one embodiment the backbone pattern comprises the first plurality of dielectric spacers 204B. The backbone pattern may be for any part of the integrated circuit being formed. As will be appreciated, backbone refers to target or desired topology to be formed by the pattern, which may be for instance a base topology upon which the remainder of the circuit is formed, or an intermediate topology. In a more general sense, backbone refers to the topology being formed, which can have any number of configurations depending on the given integrated circuit design. The backbone pattern can be formed using any standard lithography operation (e.g., 193 nm or EUV) followed by etch transfer into a hardmask (e.g., SiN, SiO$_2$, SiC) and then removal of any remaining resist and/or anti-reflection layers (e.g., thru ash or wet cleans).

In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. However, the ILD may be formed using any other material suitable for patterning on the substrate. The interlayer dielectric material may be formed by conventional techniques, such as, for example, chemical vapor deposition (CVD), physical vapor deposition (PVD), or by other deposition methods.

Figure 3B:
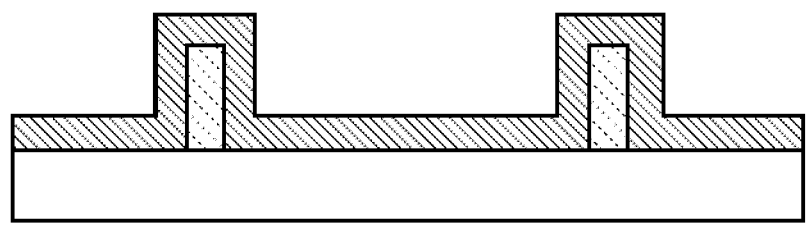

FIG. 3B illustrates a resulting structure after formation of a first conformal metal spacer material on the backbone pattern and substrate to continue formation of the first spacer pattern. In one embodiment, the first metal space material is deposited using atomic layer deposition (ALD), but any number of spacer material deposition techniques can be used, such as chemical vapor deposition (CVD), spin-on deposition (SOD), or any other suitably directional deposition technique that is capable of providing conformal layers. The first metal spacer material may be implemented with any metal material that can be deposited conformally such as, TiN, Ti, and W, and alloys thereof.

As will be appreciated, one difference between this example embodiment and conventional processes is that a metal spacer material is deposited over the backbone features, rather than deposition of a dielectric spacer material. Another difference is that neither the dielectric spacers nor the metal spacers are removed and both become part of the resulting integrated circuit, unlike conventional processes.

Figure 3C:

FIG. 3C illustrates the resulting structure after the first metal spacer material has been removed except along sidewalls of the backbone pattern. This step forms the first plurality of metal spacers 206A of FIG. 2, and completes formation of the first spacer pattern. In further detail, formation of the first plurality of metal spacers may include removing excess metal spacer material so as to reveal a top surface of the backbone pattern. This removal of excess spacer material may be accomplished, for example, by selectively etching the metal spacer material layer vertically, and may further include other processing such as planarization/polishing (e.g., chemical mechanical planarization). The vertical etch can be carried out, for instance, using an anisotropic etch or any other suitably directional or otherwise selective process that removes spacer material so as to leave behind spacers on the pattern sidewalls. Note that the width of the sidewall spacer material in this example embodiment is the same as the width of the backbone pattern. However, other thicknesses can be used as well.

Figure 3D:
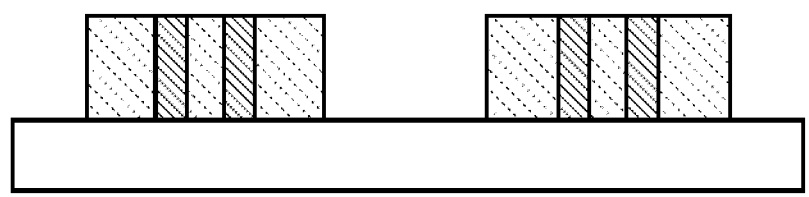

FIG. 3D illustrates an example resulting structure after formation of a second spacer pattern on the substrate or other layer, which includes forming the second plurality of dielectric spacers 204B shown in FIG. 2. This step includes conformally depositing a second dielectric spacer material over the substrate and removing the second dielectric spacer material to form the second plurality of dielectric spacers along exposed sidewalls of the first plurality of metal spacers. In one embodiment, the second plurality of dielectric spacers are formed with a width different from the first plurality of dielectric spacers. The second plurality dielectric spacers may be deposited and etched as described above with respect to the first plurality of dielectric spacers.

Figure 3E:
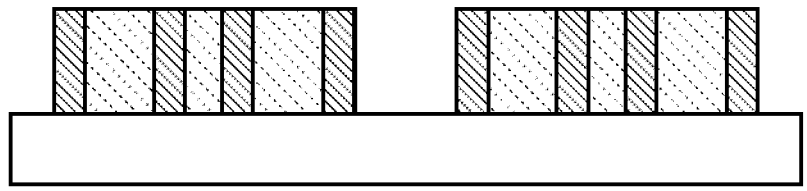

FIG. 3E illustrates an example resulting structure after forming the second plurality of metal spacers 206B of FIG. 2, completing formation of the second spacer pattern. This step includes conformally depositing a second metal spacer material over the substrate and removing the second metal spacer material to form the second metal spacers along exposed sidewalls of the second plurality of dielectric spacers. In one embodiment, the second plurality of metal spacers are formed with a same or different width as the first plurality of metal spacers and the second plurality of dielectric spacers. The second plurality metal spacers may be deposited and etched as described above with respect to the first plurality of metal spacers.

Figure 3F:
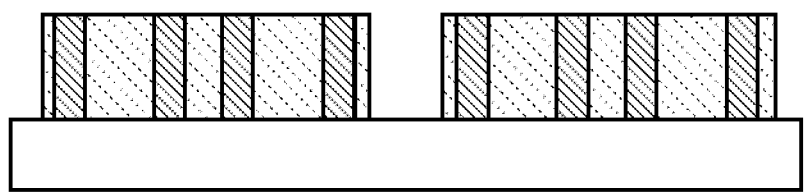

FIG. 3F illustrates an example resulting structure after formation of a third spacer pattern on the substrate or other layer, which includes forming the third plurality of dielectric spacers 204C shown in FIG. 2. This step includes conformally depositing a third layer of dielectric spacer material over the substrate and removing the third dielectric spacer material to form the third plurality of dielectric spacers along exposed sidewalls of the second plurality of metal spacers. In one embodiment, the third plurality of dielectric spacers are formed with a width different from the second plurality of dielectric spacers. In one embodiment, the first, second, and third dielectric spacer materials utilize the same dielectric materials, but the first, second, and third dielectric spacer materials may utilize two or more different dielectric materials. The third plurality dielectric spacers may be deposited and etched as described above with respect to the first plurality of dielectric spacers.

Figure 3G:
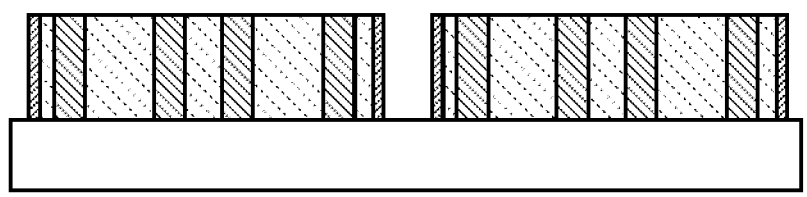

FIG. 3G illustrates an example resulting structure after forming the third plurality of metal spacers 206C of FIG. 2, completing formation of the third spacer pattern. This step includes conformally depositing a layer of a third metal spacer material over the previous structures and removing the third metal spacer material to form the third metal spacers along exposed sidewalls of the second plurality of dielectric spacers. In one embodiment, the third plurality of metal spacers are formed with a same or different width as the third plurality of dielectric spacers. In one embodiment, the first, second, and third metal spacer materials may comprise the same metal material. In another embodiment, the first, second, and third metal spacer materials may use two or more different metal materials. The third plurality metal spacers may be deposited and etched as described above with respect to the first plurality of metal spacers.

Figure 3H:
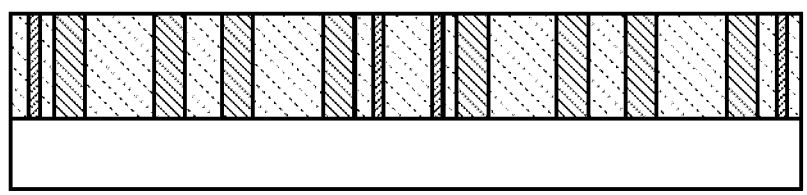

FIG. 3H illustrates an example resulting structure after any remaining gaps are filled-in with a fourth dielectric material that is polished coplanar with the other structures to arrive at the final structure shown in FIG. 2, which has metal lines and spaces of variable widths.

The metal and spacer patterning for pitch division of the present embodiments offered the flexibility of space control and line width the control, and may be used, for example, in applications where metal interconnects for high-voltage signals need to be spaced further part than metal interconnects for low voltage signals.

The integrated circuit structures described herein may be included in an electronic device. As an example of one such apparatus, FIGS. 4A and 4B are top views of a wafer and dies that include metal and dielectric spacers having multiple line and spacer widths, in accordance with one or more of the embodiments disclosed herein.

Figure 4B:
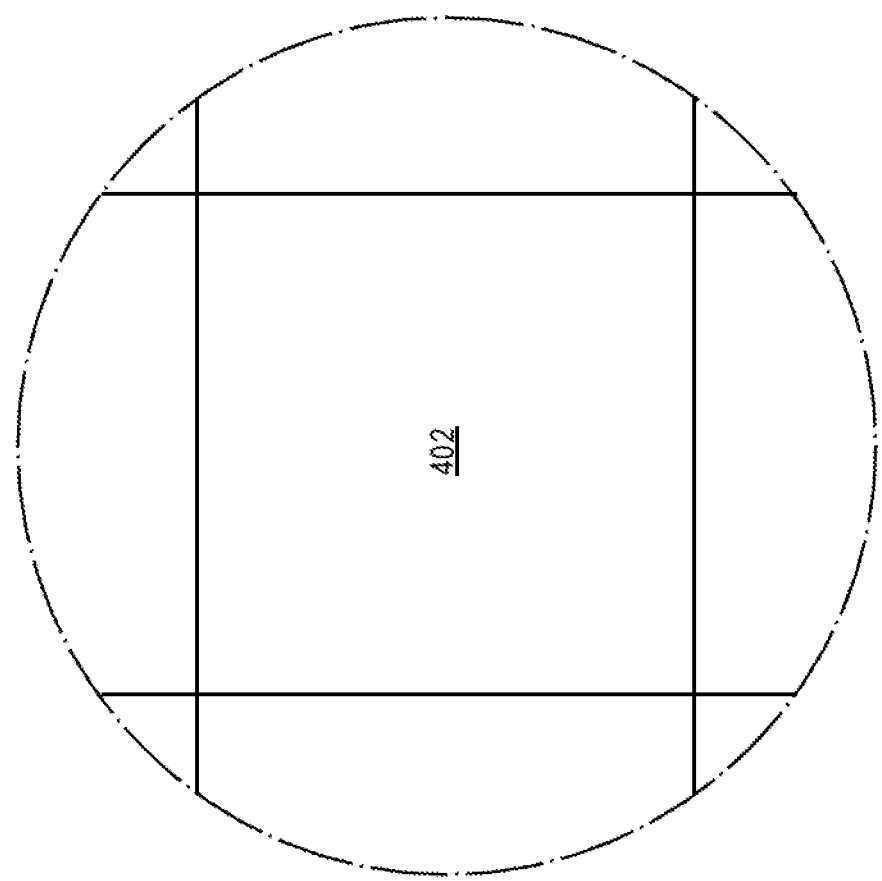
FIGS. 4A and 4B are top views of a wafer and dies that include metal and dielectric spacers having multiple line and spacer widths, in accordance with one or more of the embodiments disclosed herein.
Figure 4A:
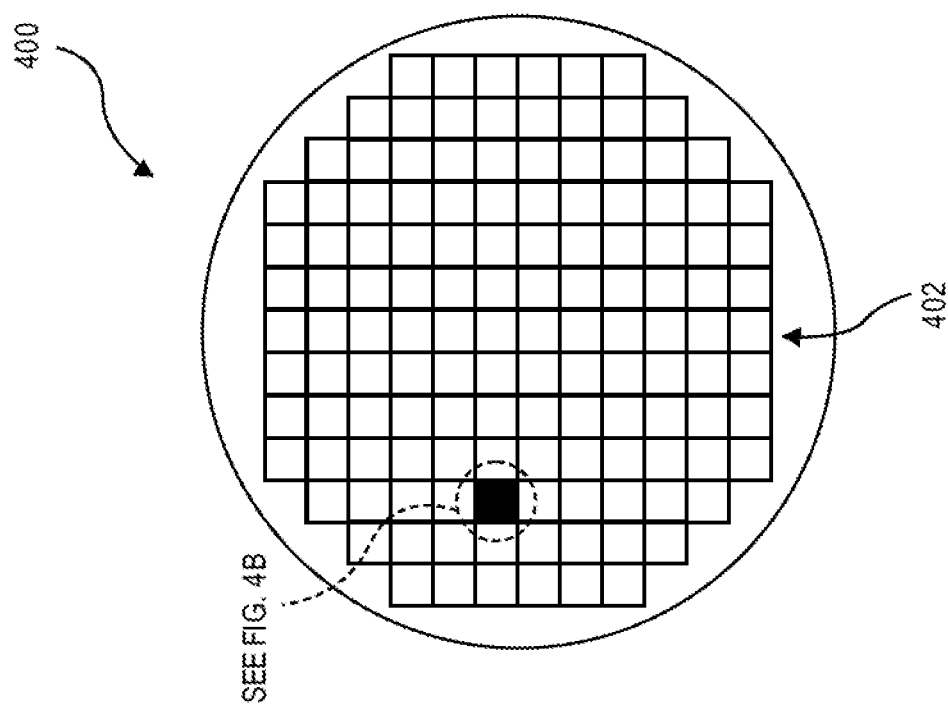

Referring to FIGS. 4A and 4B, a wafer 400 may be composed of semiconductor material and may include one or more dies 402 having integrated circuit (IC) structures formed on a surface of the wafer 400. Each of the dies 402 may be a repeating unit of a semiconductor product that includes any suitable IC (e.g., ICs including metal and dielectric spacers having multiple line and spacer widths, such as described above. After the fabrication of the semiconductor product is complete, the wafer 400 may undergo a singulation process in which each of the dies 402 is separated from one another to provide discrete "chips" of the semiconductor product. In particular, structures that include embedded non-volatile memory structures having an independently scaled selector as disclosed herein may take the form of the wafer 400 (e.g., not singulated) or the form of the die 402 (e.g., singulated). The die 402 may include one or more embedded non-volatile memory structures based independently scaled selectors and/or supporting circuitry to route electrical signals, as well as any other IC components. In some embodiments, the wafer 400 or the die 402 may include an additional memory device (e.g., a static random access memory (SRAM) device), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
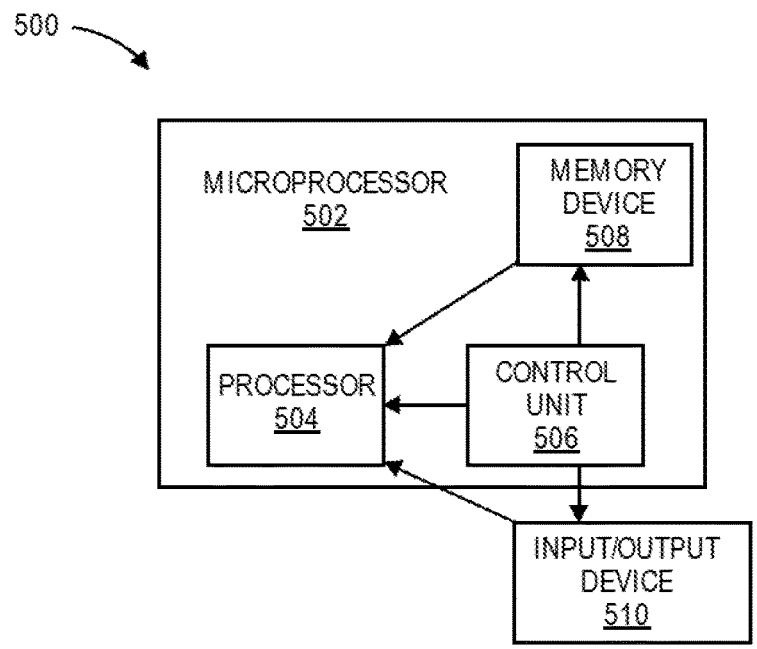
FIG. 5 illustrates a block diagram of an electronic system, in accordance with an embodiment of the present disclosure.

FIG. 5 illustrates a block diagram of an electronic system 500, in accordance with an embodiment of the present disclosure. The electronic system 500 can correspond to, for example, a portable system, a computer system, a process control system, or any other system that utilizes a processor and an associated memory. The electronic system 500 may include a microprocessor 502 (having a processor 504 and control unit 506), a memory device 508, and an input/output device 510 (it is to be appreciated that the electronic system 500 may have a plurality of processors, control units, memory device units and/or input/output devices in various embodiments). In one embodiment, the electronic system 500 has a set of instructions that define operations which are to be performed on data by the processor 504, as well as, other transactions between the processor 504, the memory device 508, and the input/output device 510. The control unit 506 coordinates the operations of the processor 504, the memory device 508 and the input/output device 510 by cycling through a set of operations that cause instructions to be retrieved from the memory device 508 and executed. The memory device 508 can include a non-volatile memory cell as described in the present description. In an embodiment, the memory device 508 is embedded in the microprocessor 502, as depicted in FIG. 5. In an embodiment, the processor 504, or another component of electronic system 500, includes metal and dielectric spacers having multiple line and spacer widths, such as those described herein.

Figure 6:
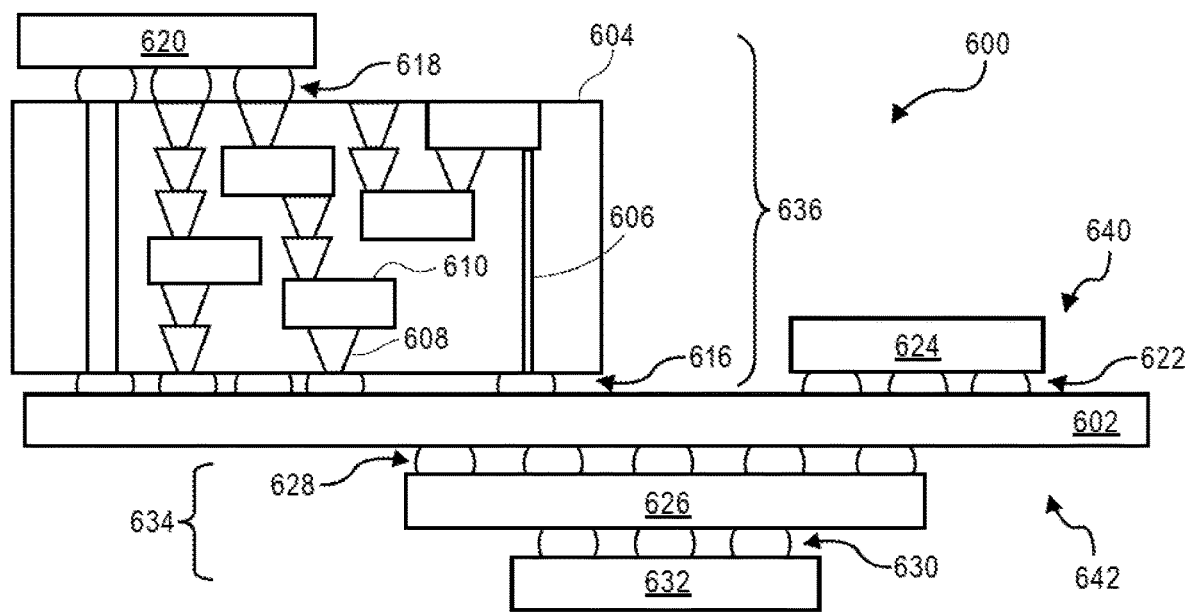
FIG. 6 is a cross-sectional side view of an integrated circuit (IC) device assembly that may include metal and dielectric spacers having multiple line and spacer widths, in accordance with one or more of the embodiments disclosed herein.

FIG. 6 is a cross-sectional side view of an integrated circuit (IC) device assembly that may include metal and dielectric spacers having multiple line and spacer widths, in accordance with one or more of the embodiments disclosed herein.

Referring to FIG. 6, an IC device assembly 600 includes components having one or more integrated circuit structures described herein. The IC device assembly 600 includes a number of components disposed on a circuit board 602 (which may be, e.g., a motherboard). The IC device assembly 600 includes components disposed on a first face 640 of the circuit board 602 and an opposing second face 642 of the circuit board 602. Generally, components may be disposed on one or both faces 640 and 642. In particular, any suitable ones of the components of the IC device assembly 600 may include a number of embedded non-volatile memory structures having a bilayer selector, such as disclosed herein.

In some embodiments, the circuit board 602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate.

The IC device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), male and female portions of a socket, an adhesive, an underfill material, and/or any other suitable electrical and/or mechanical coupling structure.

The package-on-interposer structure 636 may include an IC package 620 coupled to an interposer 604 by coupling components 618. The coupling components 618 may take any suitable form for the application, such as the forms discussed above with reference to the coupling components 616. Although a single IC package 620 is shown in FIG. 6, multiple IC packages may be coupled to the interposer 604. It is to be appreciated that additional interposers may be coupled to the interposer 604. The interposer 604 may provide an intervening substrate used to bridge the circuit board 602 and the IC package 620. The IC package 620 may be or include, for example, a die (the die 402 of FIG. 4B), or any other suitable component. Generally, the interposer 604 may spread a connection to a wider pitch or reroute a connection to a different connection. For example, the interposer 604 may couple the IC package 620 (e.g., a die) to a ball grid array (BGA) of the coupling components 616 for coupling to the circuit board 602. In the embodiment illustrated in FIG. 6, the IC package 620 and the circuit board 602 are attached to opposing sides of the interposer 604. In other embodiments, the IC package 620 and the circuit board 602 may be attached to a same side of the interposer 604. In some embodiments, three or more components may be interconnected by way of the interposer 604.

The interposer 604 may be formed of an epoxy resin, a fiberglass-reinforced epoxy resin, a ceramic material, or a polymer material such as polyimide. In some implementations, the interposer 604 may be formed of alternate rigid or flexible materials that may include the same materials described above for use in a semiconductor substrate, such as silicon, germanium, and other group III-V and group IV materials. The interposer 604 may include metal interconnects 610 and vias 608, including but not limited to through-silicon vias (TSVs) 606. The interposer 604 may further include embedded devices 614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art.

The IC device assembly 600 may include an IC package 624 coupled to the first face 640 of the circuit board 602 by coupling components 622. The coupling components 622 may take the form of any of the embodiments discussed above with reference to the coupling components 616, and the IC package 624 may take the form of any of the embodiments discussed above with reference to the IC package 620.

The IC device assembly 600 illustrated in FIG. 6 includes a package-on-package structure 634 coupled to the second face 642 of the circuit board 602 by coupling components 628. The package-on-package structure 634 may include an IC package 626 and an IC package 632 coupled together by coupling components 630 such that the IC package 626 is disposed between the circuit board 602 and the IC package 632. The coupling components 628 and 630 may take the form of any of the embodiments of the coupling components 616 discussed above, and the IC packages 626 and 632 may take the form of any of the embodiments of the IC package 620 discussed above. The package-on-package structure 634 may be configured in accordance with any of the package-on-package structures known in the art.

Figure 7:
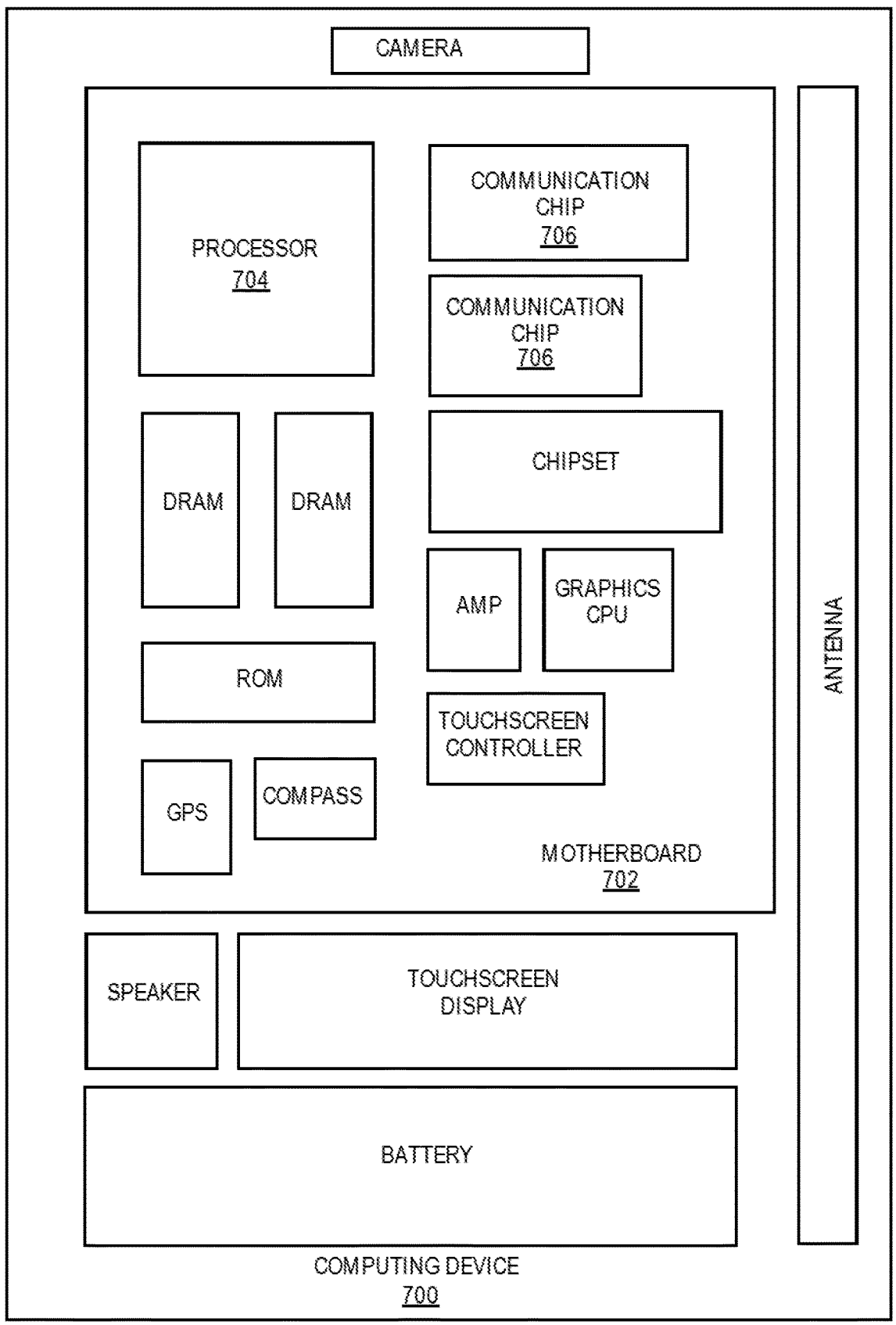
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes metal and dielectric spacers having multiple line and spacer widths, in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes metal and dielectric spacers having multiple line and spacer widths, in accordance with implementations of embodiments of the disclosure.

In further implementations, another component housed within the computing device 700 may contain an integrated circuit die that includes metal and dielectric spacers having multiple line and spacer widths, in accordance with implementations of embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments described herein include metal and dielectric spacers having multiple line and spacer widths.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a substrate. A first spacer pattern is on the substrate, the first spacer pattern comprising a first plurality of dielectric spacers and a first plurality of metal spacers formed along sidewalls of the first plurality of dielectric spacers, wherein the first plurality of dielectric spacers have a first width (W1). A second spacer pattern is on the substrate, where the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers.

Example Embodiment 2

The integrated circuit of embodiment 1, wherein the first plurality of metal spacers and the second plurality metal spacers have a same width.

Example Embodiment 3

The integrated circuit embodiment 1 or 2, wherein the first plurality of metal spacers and the second plurality metal spacers have a different width.

Example Embodiment 4

The integrated circuit embodiment 1, 2 or 3, wherein the first plurality of metal spacers and the second plurality metal spacers are formed from a same metal material.

Example Embodiment 5

The integrated circuit embodiment 1, 2 or 3, wherein the first plurality of metal spacers and the second plurality metal spacers are formed from a different metal material.

Example Embodiment 6

The integrated circuit embodiment 1, 2, 3, 4 or 5, wherein a metal material comprising the first plurality of metal spacers and the second plurality of metal spacers has a property that the metal material can be deposited via atomic layer deposition (ALD) and vertically etched.

Example Embodiment 7

The integrated circuit embodiment 1, 2, 3, 4, 5 or 6, wherein the metal material selected from titanium nitride, titanium, tungsten, and alloys thereof.

Example Embodiment 8

The integrated circuit embodiment 1, 2, 3, 4, 5, 6 or 7, wherein the interleaved first spacer pattern and the second spacer pattern form respective lines of symmetry centered on the first plurality of dielectric spacers, wherein the lines of symmetry have two sets of dielectric spacers and metal spacers that are left/right symmetric from the lines of symmetry.

Example Embodiment 9

An integrated circuit structure comprises a substrate. A first spacer pattern is on the substrate, the first spacer pattern comprising a first plurality of dielectric spacers and a first plurality of metal spacers formed along sidewalls of the first plurality of dielectric spacers, wherein the first plurality of dielectric spacers and the first plurality of metal spacers have a first width (W1). A second spacer pattern is on the substrate, the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers. A third spacer pattern is on the substrate, the third spacer pattern interleaved with the first spacer pattern and the second spacer pattern, the third spacer pattern comprising a third plurality of dielectric spacers formed on exposed sidewalls of the second plurality of metal spacers, and a third plurality of metal spacers formed on exposed sidewalls of the third plurality of dielectric spacers, wherein the third plurality of metal spacers are formed from a metal material different from the first plurality of metal spacers and the second plurality of metal spacers.

Example Embodiment 10

The integrated circuit embodiment 9, wherein the first plurality of metal spacers and the second plurality metal spacers are formed from a same metal material.

Example Embodiment 11

The integrated circuit embodiment 9, wherein the first plurality of metal spacers and the second plurality metal spacers are formed from a different metal material.

Example Embodiment 12

The integrated circuit embodiment 9, 10 or 11, wherein a metal material comprising the first plurality of metal spacers and the second plurality of metal spacers has a property that the metal material can be deposited via atomic layer deposition (ALD) and vertically etched.

Example Embodiment 13

The integrated circuit embodiment 12, wherein the metal material selected from titanium nitride, titanium, tungsten, and alloys thereof.

Example Embodiment 14

The integrated circuit embodiment 9, 10, 11, 12, 13 or 14, wherein the interleaved first spacer pattern and the second spacer pattern form respective lines of symmetry centered on the first plurality of dielectric spacers, wherein the lines of symmetry have two sets of dielectric spacers and metal spacers that are left/right symmetric from the lines of symmetry.

Example Embodiment 15

A method for fabricating a metallization layer of an integrated circuit comprises forming a first spacer pattern over a substrate, the first spacer pattern comprising a first plurality of dielectric spacers and a first plurality of metal spacers formed along sidewalls of the first plurality of dielectric spacers, wherein the first plurality of dielectric spacers have a first width (W1). A second spacer pattern is formed over the substrate, the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers.

Example Embodiment 16

The method of embodiment 15, further comprising: forming the first plurality of dielectric spacers as a backbone pattern.

Example Embodiment 17

The method of embodiment 15 or 16, wherein forming the first plurality of metal spacers further comprises depositing a first metal spacer material on the first plurality of dielectric spacers. The first metal spacer material is removed by a selective vertical etch to form the first plurality of metal spacers along sidewalls of the first plurality of dielectric spacers.

Example Embodiment 18

The method of embodiment 15, 16 or 17 wherein forming the second dielectric spacer pattern further comprises: depositing a second dielectric spacer material on the first spacer pattern and removing the second dielectric spacer material to form the second plurality of dielectric spacers along exposed sidewalls of the first plurality of metal spacers.

Example Embodiment 19

The method of embodiment 15, wherein forming the second plurality of metal spacers further comprises depositing a second metal spacer material over the substrate. The second metal spacer material is removed by a selective vertical etch to form the second plurality of metal spacers along sidewalls of the second plurality of dielectric spacers.

Example Embodiment 20

The method of claim 19, further comprising: forming the second plurality of metal spacers with a same width as the first plurality of metal spacers.

Example Embodiment 21

The method of embodiment 19, further comprising: forming the second plurality of metal spacers with a width different from the first plurality of metal spacers.

Example Embodiment 22

The method of embodiment 15, 16, 17, 18, 19, 20 or 21, further comprising: forming a third spacer pattern on the substrate, the third spacer pattern interleaved with the first spacer pattern and the second spacer pattern.

Example Embodiment 23

The method of embodiment 22, further comprising: forming the third spacer pattern to have a third plurality of dielectric spacers formed on exposed sidewalls of the second plurality of metal spacers, and a third plurality of metal spacers formed on exposed sidewalls of the third plurality of dielectric spacers.

Example Embodiment 24

The method of embodiment 23, further comprising: forming the third plurality of metal spacers from a third metal material different from a first metal material used for the first plurality of metal spacers and a second metal material used for the second plurality of metal spacers.

Example Embodiment 25

The method of embodiment 24, further comprising: selecting the first metal material, the second metal material and the third metal material from titanium nitride, titanium, tungsten, and alloys thereof.

What is claimed is:

1. An integrated circuit, comprising:
a substrate;
a first spacer pattern on the substrate, the first spacer pattern comprising a first plurality of dielectric spacers and a first plurality of metal spacers formed along sidewalls of the first plurality of dielectric spacers, wherein the first plurality of dielectric spacers have a first width (W1); and
a second spacer pattern on the substrate, the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers, wherein the interleaved first spacer pattern and the second spacer pattern form respective lines of symmetry centered on the first plurality of dielectric spacers, wherein the lines of symmetry have two sets of dielectric spacers and metal spacers that are left/right symmetric from the lines of symmetry;
wherein the first plurality of dielectric spacers comprise a backbone pattern on which the first plurality of metal spacers are formed, and wherein neither the first plurality of dielectric spacers nor the first plurality of metal spacers are removed and both become part of the integrated circuit.

2. The integrated circuit claim 1, wherein the first plurality of metal spacers and the second plurality metal spacers have a same width.

3. The integrated circuit claim 1, wherein the first plurality of metal spacers and the second plurality metal spacers have a different width.

4. The integrated circuit claim 1, wherein the first plurality of metal spacers and the second plurality metal spacers are formed from a same metal material.

5. The integrated circuit claim 1, wherein the first plurality of metal spacers and the second plurality metal spacers are formed from a different metal material.

6. The integrated circuit claim 1, wherein a metal material comprising the first plurality of metal spacers and the second plurality of metal spacers has a property that the metal material can be deposited via atomic layer deposition (ALD) and vertically etched.

7. The integrated circuit claim 6, wherein the metal material selected from titanium nitride, titanium, tungsten, and alloys thereof.

8. An integrated circuit, comprising:
a substrate;
a first spacer pattern on the substrate, the first spacer pattern comprising a first plurality of dielectric spacers and a first plurality of metal spacers formed along sidewalls of the first plurality of dielectric spacers, wherein the first plurality of dielectric spacers and the first plurality of metal spacers have a first width (W1);
a second spacer pattern on the substrate, the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers; and
a third spacer pattern on the substrate, the third spacer pattern interleaved with the first spacer pattern and the second spacer pattern, the third spacer pattern comprising a third plurality of dielectric spacers formed on exposed sidewalls of the second plurality of metal spacers, and a third plurality of metal spacers formed on exposed sidewalls of the third plurality of dielectric spacers, wherein the third plurality of metal spacers are formed from a metal material different from the first plurality of metal spacers and the second plurality of metal spacers, wherein the interleaved first spacer pattern and the second spacer pattern form respective lines of symmetry centered on the first plurality of dielectric spacers, wherein the lines of symmetry have two sets of dielectric spacers and metal spacers that are left/right symmetric from the lines of symmetry;

wherein the first plurality of dielectric spacers comprise a backbone pattern on which the first plurality of metal spacers are formed, and wherein neither the first plurality of dielectric spacers nor the first plurality of metal spacers are removed and both become part of the integrated circuit.

9. The integrated circuit claim 8, wherein the first plurality of metal spacers and the second plurality metal spacers are formed from a same metal material.

10. The integrated circuit claim 8, wherein the first plurality of metal spacers and the second plurality metal spacers are formed from a different metal material.

11. The integrated circuit claim 8, wherein a metal material comprising the first plurality of metal spacers and the second plurality of metal spacers has a property that the metal material can be deposited via atomic layer deposition (ALD) and vertically etched.

12. The integrated circuit claim 11, wherein the metal material selected from titanium nitride, titanium, tungsten, and alloys thereof.

13. A method for fabricating a metallization layer of an integrated circuit, comprising:
forming a first spacer pattern over a substrate, the first spacer pattern comprising a first plurality of dielectric spacers and a first plurality of metal spacers formed along sidewalls of the first plurality of dielectric spacers, wherein the first plurality of dielectric spacers have a first width (W1); and
forming a second spacer pattern over the substrate, the second spacer pattern interleaved with the first spacer pattern, the second spacer pattern comprising a second plurality of dielectric spacers having a second width (W2) formed on exposed sidewalls of the first plurality of metal spacers, and a second plurality of metal spacers formed on exposed sidewalls of the second plurality of dielectric spacers, wherein the interleaved first spacer pattern and the second spacer pattern form respective lines of symmetry centered on the first plurality of dielectric spacers, wherein the lines of symmetry have two sets of dielectric spacers and metal spacers that are left/right symmetric from the lines of symmetry;
wherein the first plurality of dielectric spacers comprise a backbone pattern on which the first plurality of metal spacers are formed, and wherein neither the first plurality of dielectric spacers nor the first plurality of metal spacers are removed and both become part of the integrated circuit.

14. The method of claim 13, further comprising: forming the first plurality of dielectric spacers as the backbone pattern.

15. The method of claim 13, wherein forming the first plurality of metal spacers further comprises:
depositing a first metal spacer material on the first plurality of dielectric spacers; and
removing the first metal spacer material by a selective vertical etch to form the first plurality of metal spacers along sidewalls of the first plurality of dielectric spacers.

16. The method of claim 13, wherein forming the second spacer pattern further comprises: depositing a second dielectric spacer material on the first spacer pattern and removing the second dielectric spacer material to form the second plurality of dielectric spacers along exposed sidewalls of the first plurality of metal spacers.

17. The method of claim 13, wherein forming the second plurality of metal spacers further comprises:
depositing a second metal spacer material over the substrate; and
removing the second metal spacer material by a selective vertical etch to form the second plurality of metal spacers along sidewalls of the second plurality of dielectric spacers.

18. The method of claim 17, further comprising: forming the second plurality of metal spacers with a same width as the first plurality of metal spacers.

19. The method of claim 17, further comprising: forming the second plurality of metal spacers with a width different from the first plurality of metal spacers.

20. The method of claim 13, further comprising: forming a third spacer pattern on the substrate, the third spacer pattern interleaved with the first spacer pattern and the second spacer pattern.

21. The method of claim 20, further comprising: forming the third spacer pattern to have a third plurality of dielectric spacers formed on exposed sidewalls of the second plurality of metal spacers, and a third plurality of metal spacers formed on exposed sidewalls of the third plurality of dielectric spacers.

22. The method of claim 21, further comprising: forming the third plurality of metal spacers from a third metal material different from a first metal material used for the first plurality of metal spacers and a second metal material used for the second plurality of metal spacers.

23. The method of claim 22, further comprising: selecting the first metal material, the second metal material and the third metal material from titanium nitride, titanium, tungsten, and alloys thereof.

* * * * *